(12) United States Patent
Sadana et al.

(10) Patent No.: US 12,317,760 B2
(45) Date of Patent: May 27, 2025

(54) CROSSBAR MEMORY ARRAY IN BACK END OF LINE

(71) Applicant: INTERNATIONAL BUSINESS MACHINES CORPORATION, Armonk, NY (US)

(72) Inventors: Devendra K. Sadana, Pleasantville, NY (US); Ning Li, White Plains, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 658 days.

(21) Appl. No.: 17/457,928

(22) Filed: Dec. 7, 2021

(65) Prior Publication Data

US 2023/0180637 A1 Jun. 8, 2023

(51) Int. Cl.
*H10N 70/20* (2023.01)
*G06N 3/08* (2023.01)
*H10B 63/00* (2023.01)
*H10N 70/00* (2023.01)

(52) U.S. Cl.
CPC ............ *H10N 70/231* (2023.02); *G06N 3/08* (2013.01); *H10B 63/80* (2023.02); *H10N 70/011* (2023.02); *H10N 70/826* (2023.02); *H10N 70/884* (2023.02)

(58) Field of Classification Search
CPC ................................. H10N 70/00; H10B 63/00
See application file for complete search history.

(56) References Cited

U.S. PATENT DOCUMENTS

| | | |
|---|---|---|
| 7,005,665 B2 | 2/2006 | Furkay |
| 7,501,648 B2 | 3/2009 | Chen |
| 7,893,421 B2 | 2/2011 | Lee |
| 8,374,018 B2 | 2/2013 | Lu |

(Continued)

FOREIGN PATENT DOCUMENTS

| | | |
|---|---|---|
| CN | 100399599 C | 7/2008 |
| KR | 100504701 B1 | 8/2005 |

OTHER PUBLICATIONS

Chen et al., "Integrated High Performance (100) and (110) Oriented Single-Grain Si TFTs without Seed Substrate", International Electron Devices Meeting (IEDM), 2009, IEDM09-179, pp. 8.1.1-8.1.4.

(Continued)

*Primary Examiner* — Marvin Payen
(74) *Attorney, Agent, or Firm* — L. Jeffrey Kelly

(57) ABSTRACT

A bottom electrode, a phase change material layer, the phase change material layer includes a similar lattice constant as a lattice constant of the bottom electrode, and a top electrode vertically aligned. A phase change material layer, a top electrode adjacent to a first vertical side surface of the phase change material layer, and a bottom electrode adjacent to a second vertical side surface of the phase change material layer. Forming a phase change material layer, forming a top electrode adjacent to a first vertical side surface and overlapping a first portion of an upper horizontal surface of the phase change material layer, forming a bottom electrode, adjacent to a second vertical side surface and overlapping a second portion of the upper horizontal surface of the phase change material layer, and forming a dielectric material horizontally isolating the bottom electrode and the top electrode.

12 Claims, 5 Drawing Sheets

(56) References Cited

U.S. PATENT DOCUMENTS

| | | | |
|---|---|---|---|
| 9,293,199 | B2 | 3/2016 | Krebs |
| 9,520,561 | B1 | 12/2016 | Kim |
| 10,319,908 | B2 | 6/2019 | Narayanan |
| 10,374,103 | B1 | 8/2019 | Carta |
| 10,505,111 | B1 | 12/2019 | Ok |
| 2013/0292634 | A1 | 11/2013 | Chen |
| 2019/0288192 | A1 | 9/2019 | Takahashi |
| 2019/0305043 | A1 | 10/2019 | Carta |
| 2021/0143325 | A1 | 5/2021 | Li |

OTHER PUBLICATIONS

Clark, "Electrical and Optical Properties of Amorphous Germanium," Physical Review, vol. 154, No. 3, Feb. 15, 1967, pp. 750-757.

Gokmen et al., "Acceleration of Deep Neural Network Training with Resistive Cross-Point Devices: Design Considerations", Frontiers in Neuroscience, vol. 10, Jul. 2016, pp. 1-13.

Izawa et al., "Ultrathin amorphization of single-crystal silicon by ultraviolet femtosecond laser pulse irradiation", AIP, Journal of Applied Physics, Published Online: Mar. 19, 2009, 4 pages.

Street, "Hydrogenated Amorphous Silicon (Cambridge Solid State Science Series)", Accessed on Jun. 4, 2021, Book, 5 pages.

Streetman et al., "Solid State Electronic Devices", 7th Edition, Book, Accessed on Jun. 7, 2021, 8 pages.

Yeh et al., "High Endurance Self-Heating OTS-PCM Pillar Cell for 3D Stackable Memory", 2018 Symposium on VLSI Technology Digest of Technical Papers, © 2018 IEEE, pp. 205-206.

IBM: List of IBM Patents or Patent Applications Treated as Related (Appendix P), Dec. 13, 2021, 2 pages.

Pending U.S. Appl. No. 17/457,926, filed Dec. 7, 2021, entitled: "Crossbar Memory Array in Front End of Line", 28 pages.

Pending U.S. Appl. No. 17/457,930, filed Dec. 7, 2021, entitled: "Crossbar Memory Array in Back End of Line With Crystallization Front", 31 pages.

CROSSBAR MEMORY ARRAY IN BACK END OF LINE

BACKGROUND

The present invention relates generally to a memory cell, and more particularly, to a phase change memory cell.

A memory cell may be used for data storage. A typical configuration of a non-volatile random access memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

SUMMARY

According to an embodiment of the present invention, a structure is provided. The structure including a bottom electrode on a substrate, a phase change material layer on the bottom electrode, where the phase change material layer includes a similar lattice constant as a lattice constant of the bottom electrode, and a top electrode on and vertically aligned with the phase change material layer and the bottom electrode.

According to an embodiment of the present invention, a structure is provided. The structure including a phase change material layer on a substrate, where the phase change material layer includes a similar lattice constant as a lattice constant of the bottom electrode, a top electrode on the substrate, adjacent to a first vertical side surface and overlapping a first portion of an upper horizontal surface of the phase change material layer, and a bottom electrode on the substrate, adjacent to a second vertical side surface and overlapping a second portion of the upper horizontal surface of the phase change material layer.

According to an embodiment of the present invention, a method is provided. The method including forming a phase change material layer on a substrate, where the phase change material layer includes a similar lattice constant as a lattice constant of the bottom electrode, forming a top electrode on the substrate adjacent to a first vertical side surface and overlapping a first portion of an upper horizontal surface of the phase change material layer, forming a bottom electrode on the substrate, adjacent to a second vertical side surface and overlapping a second portion of the upper horizontal surface of the phase change material layer, and forming a dielectric material horizontally isolating the bottom electrode and the top electrode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
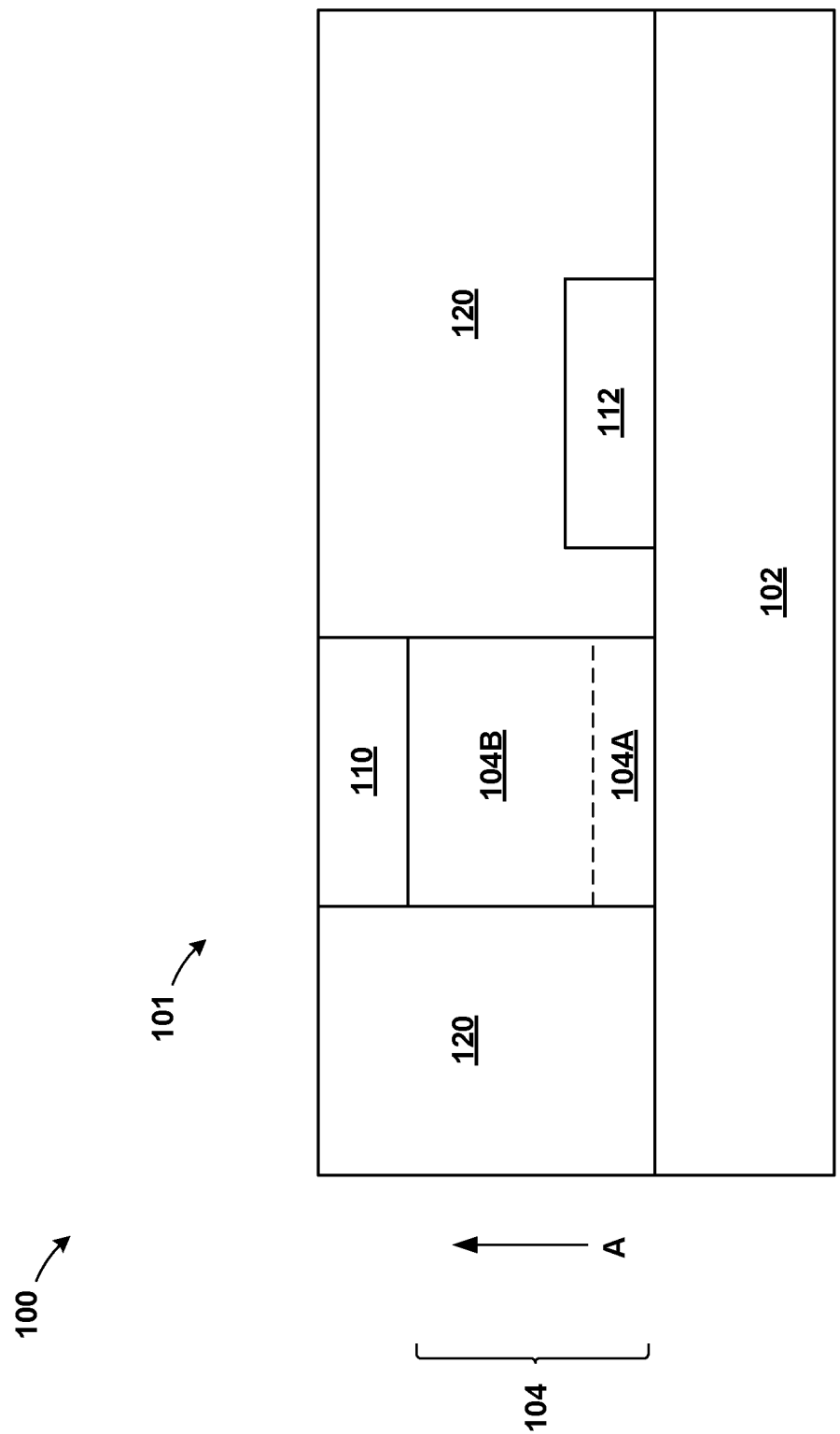
FIG. 1 illustrates a cross-sectional view of a multi-state memory cell, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A traditional phase change memory may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

Improvements in memory density which are manufactured with CMOS technology can significantly improve usage of computer systems. Applications including training of deep learning architectures such as deep neural networks and convolutional neural networks, used for applications such as natural language processing, visual object detection, speech recognition and medical image analysis, require computationally intensive tasks dependent on significant memory storage for training. Increases in memory density can significantly improve efficiency and speed of training of deep learning architectures.

Non-volatile memory technologies such as phase change memory and resistive random-access memory can be used for deep neural networks (DNN) and other memory intensive applications. Resistive processing unit (RPU) devices which can store and process weights are potentially scalable to billions of nodes with CMOS technology. RPU devices used as a multi-state (or multi-level or analog) memory cell which is capable of storing weights such as used for training of neural networks can accelerate training, for example, by 30,000 times faster. A two-dimensional crossbar array of two-terminal RPU devices may be used. Stored conductance values in the crossbar array form a matrix with weights which may be updated during DNN training, minimizing data movement during training, and accelerating DNN training while using less power. Data movement is minimized due to local storage of weights. Training is accelerated due to local storage of weights and use of multi-state memory cells rather than two state memory cells.

An RPU device designed with CMOS circuitry meeting specific requirements may be used to meet big data problems with significantly reduced training time requirements. Requirements for an RUP device may include pulse duration of 1 ns, operating voltage, Vs=1V, maximum device area 0.04 cubic micrometers, average device resistance of 24 MΩ, tolerance of 7 MΩ, maximum device resistance 84 MΩ, with tolerance 7 MΩ, minimum device resistance 14 MΩ with tolerance 7 MΩ, resistance change at +/−Vs of 70 KΩ with tolerance of 21 KΩ resistance change at +/−Vs/2 of 7 KΩ storage capacity of 7 KΩ storage capacity of 1000 levels and device up/down asymmetry of 1.05 with 2% tolerance.

In consideration of an RPU device which has a footprint of approximately 30 nm square and approximately 10 nm tall, a resistivity can be calculated, where resistance (R) is equal to resistivity of conductor material (ρ), multiplied by length of conductor (L), divided by cross-section area of conductor (A).

$$R=\rho*L/A=\rho*10 \text{ nm}/(30 \text{ nm}*30 \text{ nm})$$

Referring to the requirements for an RPU device with a minimum device resistance of 14 MΩ and a maximum device resistance of 84 MΩ, a range for the resistivity of conductor material (ρ) is between 126 Ωcm and 576 Ωcm. Equivalently, a range for the conductivity of conductor material (σ) is between $8 \times 10^{-3}$ $\Omega^{-1}$ $cm^{-1}$ and $1 \times 10^{-3}$ $\Omega^{-1}$ $cm^{-1}$, as shown in Table 1 below.

TABLE 1

| R | 14 MΩ | 84 MΩ |
|---|---|---|
| ρ | 126 Ωcm | 756 Ωcm |
| σ | $8 \times 10^{-3}$ $\Omega^{-1}$ $cm^{-1}$ | $1 \times 10^{-3}$ $\Omega^{-1}$ $cm^{-1}$ |

In an embodiment, an amorphous material meeting the specifications above can be used in an RPU device as a memory device.

Silicon, germanium and silicon germanium can all be transformed into an amorphous state or phase. In accordance with embodiments of the present invention, amorphous silicon, amorphous germanium and amorphous silicon germanium meet the resistivity requirements of an RPU device, can be manufactured with CMOS technology and can be used as a phase change material in an RPU device. For example, by using ultraviolet femtosecond laser pulse irradiation.

A required electrical current can be calculated to transform silicon into an amorphous phase. In an example, for silicon with a surface area of 30 nm square and 10 nm tall, a required electrical current to amorphized the silicon is 44 MW/cm, corresponding to 110 uA of current at an applied voltage of 4V. This has a corresponding resistance at a crystalline state of 40 KΩ and a corresponding resistivity of 0.36 Ωcm.

In an embodiment, the chosen phase change material, such as silicon, germanium or silicon germanium, may be deposited or epitaxially grown on a substrate and treated with an electrical injection to transform the chosen phase change material into an amorphous material.

Embodiments of the present invention generally relate to a memory cell, and more particularly, to a phase change memory cell with multiple states using alternative materials, such as silicon, silicon germanium and germanium. The phase change memory cell may be configured in a crossbar array and may be manufactured with standard CMOS technology on a semiconductor with other CMOS logic such as microprocessors, field effect transistors and other active and passive devices. The phase change memory cell may be formed directly on a substrate during front end of line processing. Alternatively, the phase change memory cell may be formed during back end of line processing. In an embodiment, the phase change memory cell may include a crystallization seed layer which provides a controlled crystallization when changing from an amorphous phase to a crystallized phase.

A crystallization front may be an interface between a crystallized portion and a non-crystallized portion, of phase change material in the phase change memory cell. Crystallization of the phase change material has progressed up to the crystallization front. The crystallization or crystallization front is controlled by applying a controlled voltage and current to the phase change material layer.

Two main advantages of the current invention compared to conventional phase change memory (PCM) include a controlled crystallization of the phase change material, because there is a crystallization template, as compared to spontaneous crystallization in conventional PCM, and a simpler structure and manufacturing steps compared to conventional PCM, e.g. there is no need for a heater/tip structure.

Referring now to FIG. 1, a cross-sectional view of a structure 100 is shown, according to an embodiment. The structure 100 may include a cell 101. The cell 101 includes, for example, a phase change material layer 104, a bottom electrode 112, a top electrode 110 and a dielectric 120.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick.

The substrate 102 may be, for example, a layered semiconductor such as a SiGe-on-insulator, where a buried insulator layer, separates a base substrate, for example a base substrate, from a top semiconductor layer. In an embodiment, the top semiconductor layer is a silicon germanium layer having a relatively low concentration of germanium, such as, for example, a germanium concentration of 20 atomic percent or less. The top semiconductor layer may have a thickness ranging from about 1 nm to about 50 nm, more preferably ranging from about 10 nm to about 40 nm, and most preferably ranging from about 20 nm to about 30 nm. Components of the structure 100 may be subsequently formed in or from the top semiconductor layer of the SOI silicon on insulator or SGOI (silicon-germanium on insulator) substrate.

In the illustrated embodiment, the cell 101 is formed directly on the substrate 102 during front end of line processing.

In an alternate embodiment, the substrate 102 may be a substrate with connections and structures, such as, for example, transistors and isolations built on it, and the cell 101 formed over the other structures, as an end of line embodiment.

A phase change material may be blanket deposited on top of the structure 100. Conventional deposition processes, such as electroplating, electroless plating, chemical vapor deposition, physical vapor deposition, or a combination of methods, can be used to deposit the phase change material on the structure 100. According to embodiments of the present invention, the phase change material may be formed from a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the phase change material, while maintaining the spirit of the present principles disclosed herein. In an embodiment, the phase change material may be made of a chalcogenide alloy such as germanium-antimony-tellurium (GST). According to another embodiment, the phase change material may also be made of a transition metal oxide having multiple resistance states. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO ($PrxCa1-xMnO_3$). In yet another embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag). The phase change material may be patterned using patterning techniques known in the art, forming the phase change material layer 104 portion of the cell 101. More specifically, portions of the phase change material may be selectively removed using an anisotropic etching technique, such as, for example, reactive ion etching. In an embodiment, the phase change material layer 104 may have a thickness ranging from about 10 nm to about 100 nm, although a thickness less than 10 nm and greater than 100 nm may be acceptable.

In a preferred embodiment, the phase change material layer 104 may be formed from silicon (Si), germanium (Ge), or silicon germanium (SiGe).

In an embodiment, the bottom electrode 112 and the top electrode 110 are formed from a conductive material layer which is blanket deposited on top of the structure 100, and directly on a top surface of the substrate 102 and on the phase change material layer 104. The conductive material layer may include materials such as, for example, copper, tungsten, cobalt, or aluminum. The conductive material layer may be deposited using typical deposition techniques, for example, atomic layer deposition, molecular layer deposition, and chemical vapor deposition. The bottom electrode 112 and the top electrode 110 are patterned from the conductive material layer, using known patterning and etching techniques. More specifically, portions of the conductive material layer may be selectively removed using an anisotropic etching technique, such as, for example, reactive ion etching. In an embodiment, the bottom electrode 112 and the top electrode 110 may have a thickness ranging from about 10 nm to about 100 nm, although a thickness less than 10 nm and greater than 100 nm may be acceptable.

After the aforementioned layers and materials are formed or deposited, they are patterned into the cells 101, as depicted. The cells 101 can be formed using patterning techniques known in the art. The cell 101 may include vertically aligned portions of the phase change material layer 104 and the top electrode 110. A width of the phase change material layer 104 may be equal to a width of the top electrode 110.

The dielectric 120 may surround the cell 101 and provide isolation between the bottom electrode 112 and the vertically aligned portions of the phase change material layer 104 and the top electrode 110 and may surround the cell 101. The dielectric 120 can be deposited across the top of the structure 100 in a blanket layer using any known deposition techniques, such as, for example, chemical vapor deposition, atomic layer deposition, physical layer deposition, or some combination thereof. More specifically, the dielectric 120 may be deposited within and generally fill the spaces between adjacent cells 101 and between the bottom electrode 112 and the phase change material layer 104 and the top electrode 110. The dielectric 120 may include materials, such as, for example, an oxide, a nitride, or some combination thereof. In an embodiment, the dielectric 120 may include an oxide, such as, silicon oxide. In an alternate embodiment, the dielectric 120 may include a nitride, such as, silicon nitride. A chemical mechanical planarization technique may optionally be used to polish the dielectric 120, and provide a substantially smooth and uniform surface in preparation for subsequent processing techniques.

The phase change material layer 104 may include a lower portion 104A and an upper portion 104B. A volume of the lower portion 104A and the upper portion 104B together equals a total volume of the phase change material layer 104. In an embodiment, the lower portion 104A is crystallized phase change material and the upper portion 104B is non-crystallized phase change material.

The phase change material layer 104 may have multiple resistance states dependent on an amount of crystallization of the phase change material layer 104. As an amount of crystallization of the phase change material layer 104 increases, the amount of the lower portion 104A increases in a direction of the arrow A, while the amount of the upper portion 104B decreases. As an amount of crystallization of the phase change material layer 104 increases, corresponding to an increase in a height or volume of the lower portion 104A and a decrease in a height or volume of the upper portion 104B, a resistance of the phase change material layer 104 decreases. As an amount of crystallization of the phase change material layer 104 decreases, a resistance of the phase change material layer 104 increases. Differences in an amount of crystallization of the phase change material layer 104 can be attributed to different resistances of the phase change material layer 104 which can be used to correspond to different memory states of the cell 101.

In first example, a height or a volume of the lower portion 104A may be 25% of a height or a volume of the phase change material layer 104, and a height or a volume of the upper portion 104B may be 75% of the height or the volume of the phase change material layer 104. In a second example, the height or a volume of the lower portion 104A may be 75% of a height or a volume of the phase change material layer 104, and the height or a volume of the upper portion 104 may be 25% of the height or the volume of the phase change material layer 104. A resistive state of the first example is higher than a resistive state of the second example, as the amount of crystallization of the of the phase change material layer 104 is greater in the second example. The first example and the second example are each an example of a resistive state of the cell 101 and may each correspond to a memory state of the cell 101.

A crystallization front may be an interface between the crystallized portion, the lower portion 104A, of the phase change material layer 104 and the non-crystallized portion, the upper portion 104B, of the phase change material layer 104. Crystallization of the phase change material layer 104 has progressed up to the crystallization front. The crystallization or crystallization front is controlled by applying a controlled voltage and current to the phase change material layer 104 between the bottom electrode 112 and the top electrode 110. The controlled voltage will apply current thought the substrate 102 to control crystallization of the phase change material layer 104 which starts at the substrate 102 and grows upward away from the substrate 102. The cell 101 including a surrounding portion of the substrate 102 may be isolated from other cells 101 and other portions of the substrate 102, for example, with the dielectric 120 and a shallow trench isolation or equivalent.

The substrate 102 may act as a crystallization seed for the phase change material layer 104, as a template to control the crystallization front. In an embodiment, a material used for the phase change material layer 104 may have a similar lattice constant as a material of the substrate 102, providing the crystallization seed, where the cell 101 is formed directly on the substrate 102 during front end of line processing. The crystallization seed allows for more fine-tuned control of the crystallization of the phase change material layer 104 needed for a multi-state memory cell.

Advantages of a crystallization seed for the phase change material layer 104 compared to a phase change material cell without a template include reduction of phase segregation and reduction of random crystallization.

Although only one individual cell 101 is shown, it should be noted that the structure 100 would typically include an array of several thousand cells formed according to the methods disclosed herein.

In an embodiment, a combination of more than one cell 101 may make up a single multi-state memory cell, and a combined resistance of the combination of more than one individual cell 101 may determine a memory state.

In an embodiment, an array of cells 101, or an array of combinations of more than one individual cell 101 may be connected in word lines and bit lines.

The structure 100 may provide a resistive processing unit device used for memory with a phase change material layer 104. The phase change material layer 104 is capable of storing multiple resistive levels for multiple memory states as a front end of line structure. The phase change material layer 104 is an amorphous material which may have a varying amount of crystallization providing measurable differences in resistance levels for specific memory states.

Figure 2:
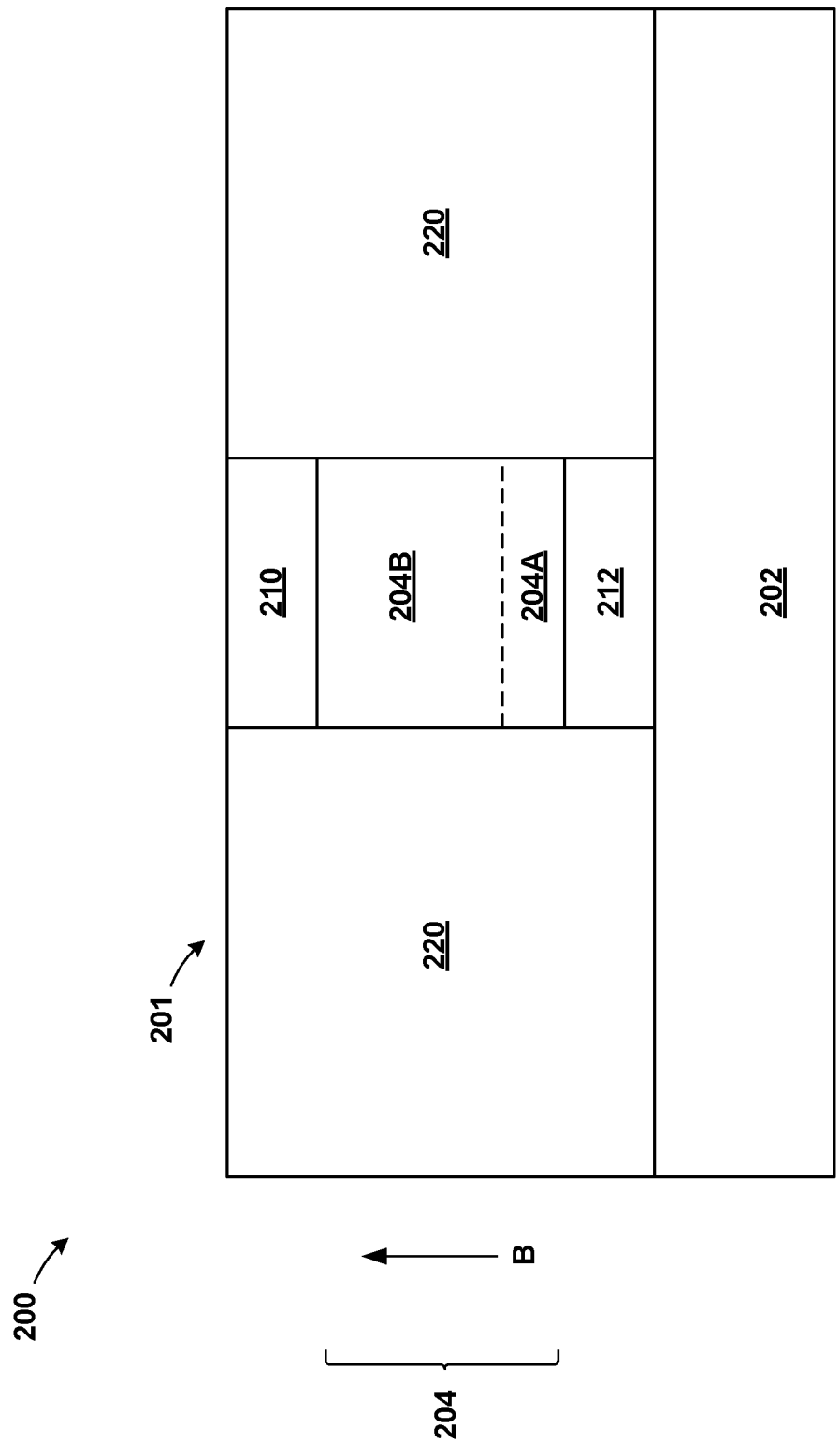
FIG. 2 illustrates a cross-sectional view of a multi-state memory cell, according to an exemplary embodiment.

Referring now to FIG. 2, a cross-sectional view of a structure 200 is shown, according to an embodiment. The structure 200 may include a cell 201. Each cell 201 includes, for example, a phase change material layer 204, a bottom electrode 212, a top electrode 210, and a dielectric 220 on a substrate 202.

The substrate 202 may be as described for the substrate 102. In an embodiment, the substrate 202 may be a substrate with connections and structures, such as, for example, transistors and isolations built on it, and the cell 201 formed over the other structures, as a back end of line embodiment.

The bottom electrode 212 may be blanket deposited on top of the structure 200, and directly on a top surface of the substrate 202, and formed as described for the bottom electrode 112 and the top electrode 110 of FIG. 1. The phase change material layer 204 may be blanket deposited on top of the structure 200 on the bottom electrode 212 and formed as described for the phase change material layer 104. The top electrode 210 may be blanket deposited on top of the structure 100, and directly on a top surface of the phase change material layer 204. The top electrode 210 may be formed as described for the top electrode 110.

After the aforementioned layers and materials are formed or deposited, they are patterned into the cells 201, as depicted. The cells 201 can be formed using patterning techniques known in the art. More specifically, portions of the conductive material layer of the bottom electrode 212, the phase change material layer 204 and the top electrode 210 may be selectively removed using an anisotropic etching technique, such as, for example, reactive ion etching. The cell 201 may include vertically aligned portions of the bottom electrode 212, the phase change material layer 204 and the top electrode 210.

The dielectric 220 may surround the cell 201 and provide isolation between adjacent cells 201. The dielectric 220 may be formed as described for the dielectric 120.

The phase change material layer 204 may include a lower portion 204A and an upper portion 204B, as described for the lower portion 104A and the upper portion 104B of FIG. 1. A total volume of the lower portion 204A and the upper portion 204B equals a total volume of the phase change material layer 204.

The phase change material layer 204 may have multiple resistance states dependent on an amount of crystallization of the phase change material layer 204. As an amount of crystallization of the phase change material layer 204 increases, the amount of the lower portion 204A increases in a direction of the arrow B, while the amount of the upper portion 204B decreases. As an amount of crystallization of the phase change material layer 204 increases, corresponding to an increase in a height or volume of the lower portion 204A and a decrease in a height or volume of the upper portion 204B, a resistance of the phase change material layer 204 decreases. As an amount of crystallization of the phase change material layer 204 decreases, a resistance of the phase change material layer 204 increases. Differences in an amount of crystallization of the phase change material layer 204 can be attributed to different resistances of the phase change material layer 204 which can be used to correspond to different memory states of the cell 201.

Differences in an amount of crystallization of the phase change material layer 204 may be controlled by applying a controlled voltage to the phase change material layer 204 between the bottom electrode 212 and the top electrode 210. The controlled voltage will apply current through the bottom electrode 212 to control crystallization of the phase change material layer 204 which starts at the bottom electrode 212 and grows towards the upward away from the substrate 202.

The bottom electrode 212 may be a growth template for the phase change material layer 204, due to having a similar lattice constant. The bottom electrode 212 may function as a crystallization seed layer used to help change the phase change material layer 204, for example amorphous silicon, into polycrystalline silicon. In an embodiment, the bottom electrode 212 may have a similar lattice constant as the phase change material 204.

Although only one individual cell 201 is shown, it should be noted that the structure 200 would typically include an array of several thousand cells formed according to the methods disclosed herein.

In an embodiment, a combination of more than one individual cell 201 may make up a single multi-state memory cell, and a combined resistance of the combination of more than one cell 201 may determine a memory state.

In an embodiment, an array of cells 201, or an array of combinations of more than one individual cell 201 may be connected in word lines and bit lines.

The structure 200 may provide a resistive processing unit device used for memory with a phase change material layer 204 capable of storing multiple resistive levels for multiple memory states as a back end of line structure for changing of amorphous material used in the phase change material layer 204 into a varying amount of crystallization providing measurable differences in resistance levels for specific memory states.

Figure 3:
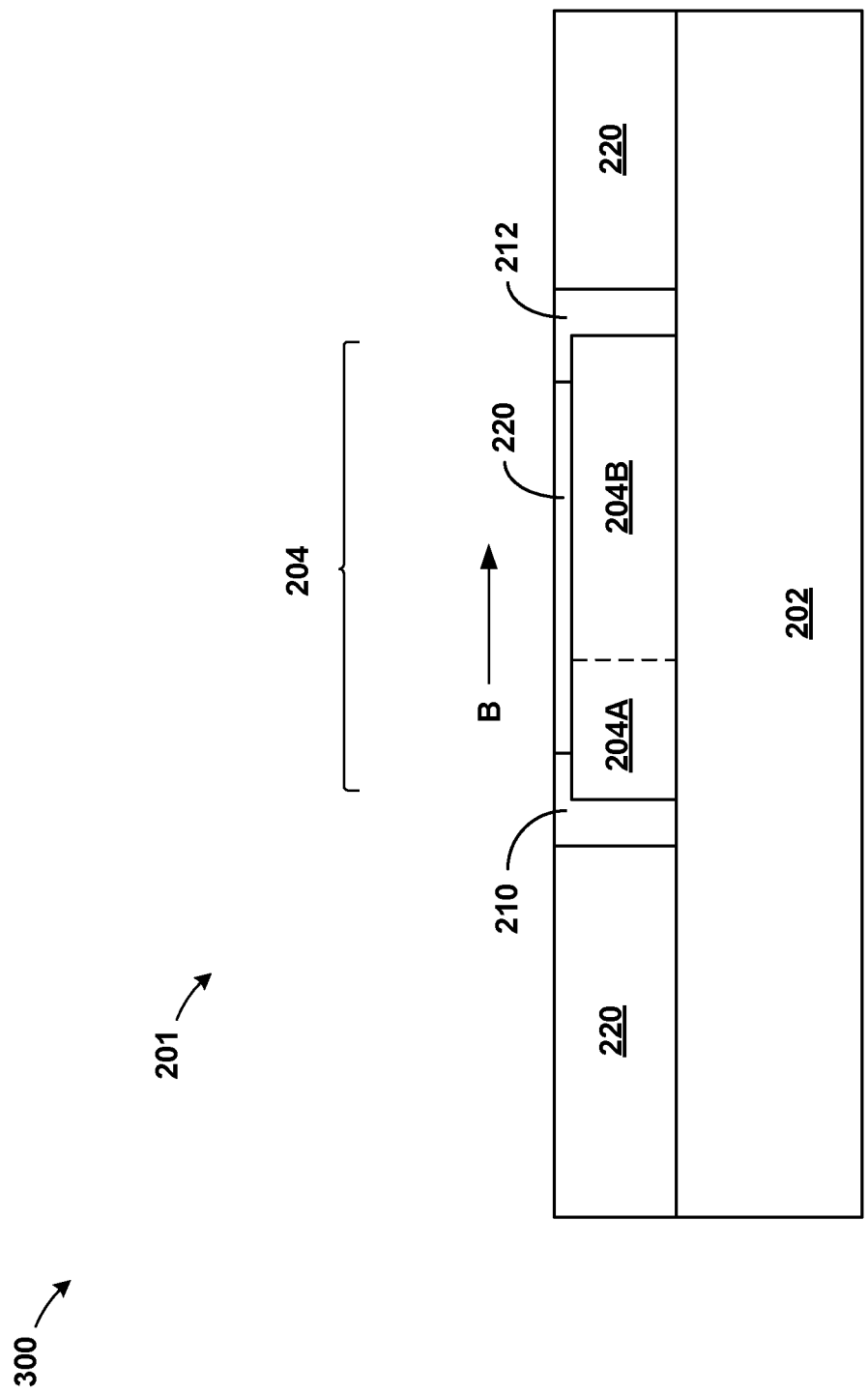
FIG. 3 illustrates a cross-sectional view of a multi-state memory cell, according to an exemplary embodiment.

Referring now to FIG. 3, a cross-sectional view of a structure 300 is shown, according to an alternate embodiment. The structure 300 is shown with the phase change material layer 204, a bottom electrode 212, a top electrode 210 and a dielectric 220 aligned horizontally on the substrate 202, rather than vertically as shown in FIG. 2.

The phase change material layer 204 may be formed as described for the phase change material layer 104 and formed directly on the substrate 202. The bottom electrode 212 may be formed as described above, on the substrate 202 directly adjacent to the phase change material layer 204 and overlapping a portion of an upper surface of the phase change material layer 204. The top electrode 210 may be formed as described above on the substrate 202 directly adjacent to the phase change material layer 204 on an opposite side of the phase change material layer 204 than the bottom electrode 212 and overlapping a different portion of the upper surface of the phase change material layer 204. A dielectric (not shown) may be formed on the structure 200, and insulate the bottom electrode 212 from the top electrode 210.

Differences in an amount of crystallization of the phase change material layer 204 may be controlled by applying a controlled voltage to the phase change material layer 204 between the bottom electrode 212 and the top electrode 210. The controlled voltage will apply current through the bottom electrode 212 to control crystallization of the phase change material layer 204 which starts at the bottom electrode 212 and grows towards the top electrode 210, increasing the lower portion 204A and decreasing the upper portion 204B.

Figure 4:
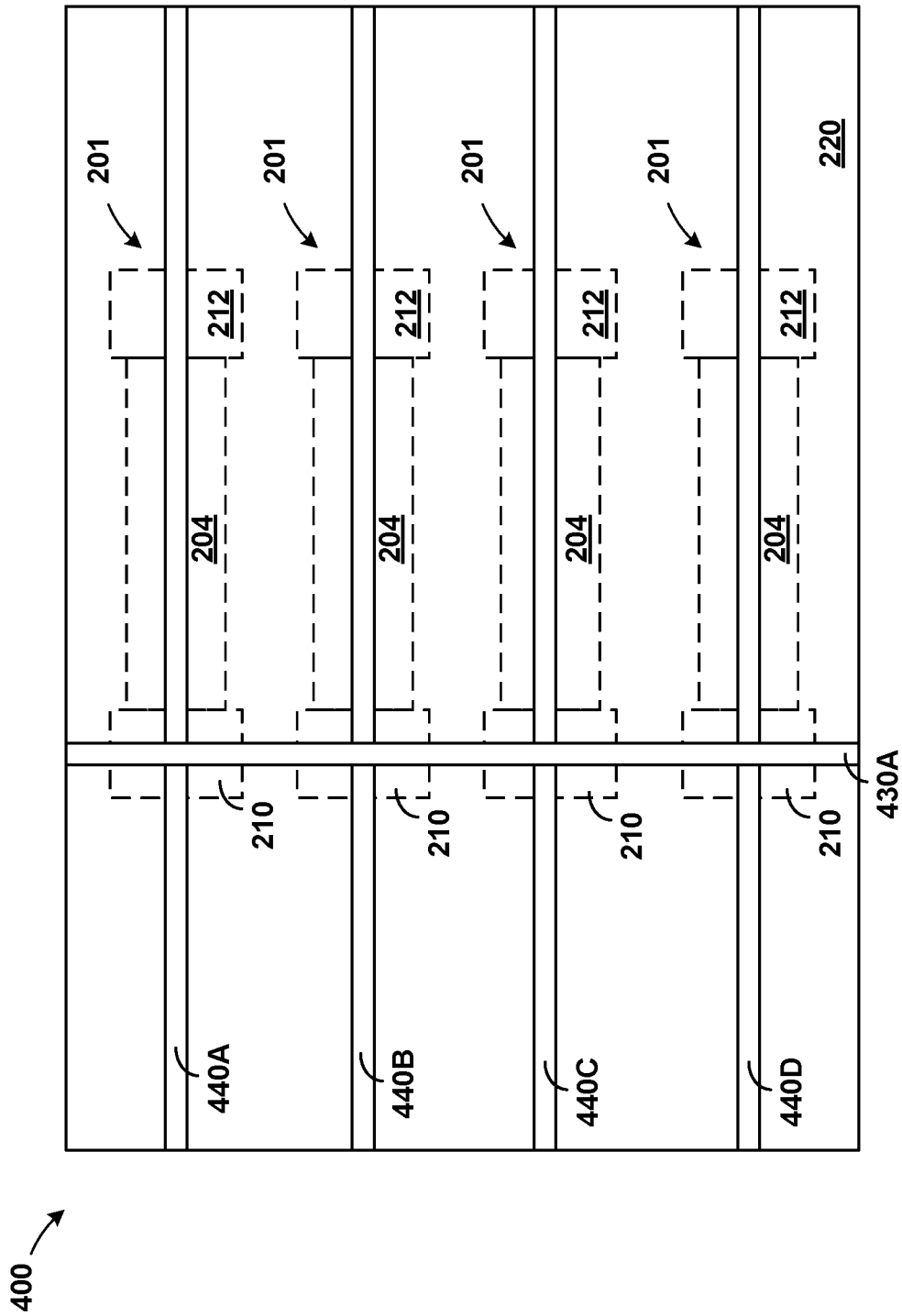
FIG. 4 illustrates a top view of a memory array, according to an exemplary embodiment.

Referring now to FIG. 4, a top view of a memory array 400 is shown, according to an embodiment.

The memory array 400 includes a word line 430A and bit lines 440A, 440B, 440C, 440D orthogonally arranged using connected top electrodes 210 and connected bottom electrodes 212 as shown in FIG. 3. A dielectric, such as the dielectric 220 may isolate the work line 430A and the bit lines 440A, 440B, 440C and the array of 4 cells 201. The bottom electrodes 212 of the four cells 201, shown as dashed lines, may be connected in horizontal lines, as viewed from above. The top electrodes 211 of the four cells 201, shown as dashed lines, may be connected in vertical lines, as viewed from above. The connected bottom electrodes 212 and the connected top electrodes 210 may be reversely connected and each may function as either a word line or as a bit line when arranged as a crosspoint array.

Figure 5:
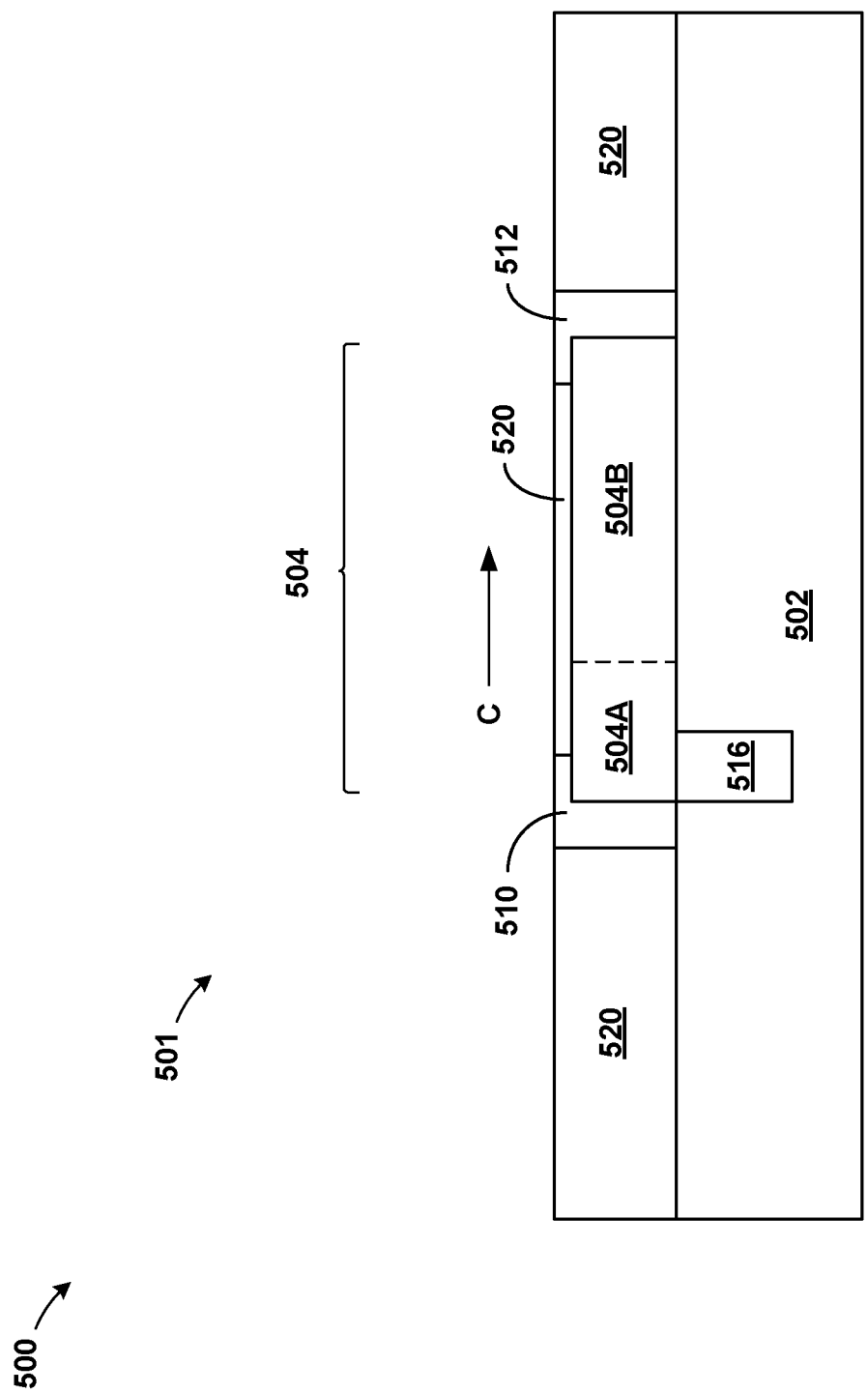
FIG. 5 illustrates a cross-sectional view of a multi-state memory cell, according to an exemplary embodiment.

Referring now to FIG. 5, a cross-sectional view of a structure 500 is shown, according to an embodiment. The structure 500 may include a cell 501. Each cell 501 includes, for example, a phase change material layer 504, a bottom electrode 512, a top electrode 510, and a dielectric 520, aligned horizontally on a substrate 502. A crystallization seed layer 516 may be formed in the substrate 502. The phase change material layer 504 may include a lower portion 504A and an upper portion 504B. A total volume of the portion 504A and the portion 504B equals a total volume of the phase change material layer 504.

The substrate 502 may be as described for the substrate 102. In an embodiment, the substrate 502 may be a substrate with connections and structures, such as, for example, transistors and isolations built on it, and the cell 501 formed over the other structures, as a back end of line embodiment.

The crystallization seed layer 516 may be used for metal induced crystallization for turning the phase change material layer 504 into a crystalline state. The crystallization seed layer 516 may used to help change the phase change material layer 504, for example amorphous silicon, into polycrystalline silicon. In an embodiment, the crystallization seed layer 516 may have a similar lattice constant as the phase change material 504.

The phase change material layer 504 may have multiple resistance states dependent on an amount of crystallization of the phase change material layer 504. As an amount of crystallization of the phase change material layer 504 increases, the amount of the lower portion 504A increases in a direction of the arrow C, while the amount of the upper portion 504B decreases. As an amount of crystallization of the phase change material layer 504 increases, corresponding to an increase in a height or volume of the lower portion 504A and a decrease in a height or volume of the upper portion 504B, a resistance of the phase change material layer 504 decreases. As an amount of crystallization of the phase change material layer 504 decreases, a resistance of the phase change material layer 504 increases. Differences in an amount of crystallization of the phase change material layer 504 can be attributed to different resistances of the phase change material layer 504 which can be used to correspond to different memory states of the cell 501.

Differences in an amount of crystallization of the phase change material layer 504 may be controlled by applying a controlled voltage to the phase change material layer 504 between the bottom electrode 512 and the top electrode 510. The controlled voltage will apply current through the bottom electrode 512 to control crystallization of the phase change material layer 504 which starts at the bottom electrode 512 and grows upward away from the substrate 502.

The crystallization seed layer 516 may be formed by etching a portion of the substrate 502 forming a trench (not shown). Material used for the crystallization seed layer 516 may be a material capable of being used to induce crystallization of the phase change material layer 504, for example, nickel (Ni) may be used. Deposition processes, such as low pressure chemical vapor deposition (LPCVD), electroplating, electroless plating, chemical vapor deposition, physical vapor deposition, or a combination of methods, can be used to deposit the crystallization seed layer 516 in the trench (not shown).

In an embodiment, the crystallization seed layer 516 may be amorphous silicon, nickel, an amorphous silicon-nickel alloy or amorphous silicon with a bottom nickel portion. The crystallization seed layer 516 may be used to help change the phase change material layer 504, for example amorphous silicon, into polycrystalline silicon. The crystallization seed layer 516 may serve as a "grain filter", limiting or eliminating the propagation of structural defects (such as stacking faults and point defects) from the crystallization seed layer 516 into the phase change material layer 504. As known, presence of a metal such as nickel may enhance the crystallization and/or reduce the activation energy needed for crystallization of the amorphous material due to metal-induced crystallization. In some embodiments, crystallization (metal or non-metal induced) may be assisted by laser annealing.

The phase change material layer 504 may be formed as described for the phase change material layer 204 and formed directly on the substrate 502, over the crystallization seed layer 516 and extending beyond the crystallization seed layer 516. The bottom electrode 512 and the top electrode 510 may be formed as described for the bottom electrode 212 and the top electrode 210. The dielectric 520 may be formed as described for the dielectric 220.

The phase change material layer 504 may have multiple resistance states dependent on an amount of crystallization of the phase change material layer 504. In an embodiment, the portion 504A is crystallized phase change material and the portion 504B is non-crystallized phase change material. As an amount of crystallization of the phase change material layer 504 increases, the amount of the portion 504A increases in a direction of the arrow C, while the amount of the portion 504B decreases. As an amount of crystallization of the phase change material layer 504 increases, a resistance of the phase change material layer 504 decreases. As an amount of crystallization of the phase change material layer 504 decreases, a resistance of the phase change material layer 504 increases. Differences in an amount of crystallization of the phase change material layer 504 can be attributed to different resistances which correspond to different memory states.

Differences in an amount of crystallization of the phase change material layer 504 may be controlled by applying a controlled voltage to the phase change material layer 504 between the bottom electrode 512 and the top electrode 510.

The controlled voltage will apply current thought the bottom electrode 512 to control crystallization of the phase change material layer which starts at the bottom electrode 512 and grows upward away from the substrate 502, growing from the crystallization seed layer 516. The cell 501 including a surrounding portion of the substrate 502 may be isolated from other cells 501 and other portions of the substrate 502.

Although only one individual cell 501 is shown, it should be noted that the structure 500 would typically include an array of several thousand cells all formed according to the methods disclosed herein.

In an embodiment, a combination of more than one individual cell 501 may make up a single multi-state memory cell, and a combined resistance of the combination of more than one cell 501 may determine a memory state.

In an embodiment, an array of cells 501, or an array of combinations of more than one individual cell 501 may be connected in word lines and bit lines.

The structure 500 may provide a resistive processing unit device used for memory with a phase change material layer 504 capable of storing multiple resistive levels for multiple memory states as a back end of line structure with a controlled crystallization for controlled changing of amorphous material used in the phase change material layer 504 into a controlled amount of crystallization providing measurable differences in resistance levels for specific memory states.

In an embodiment, the structure 500 may be formed directly on a substrate without intervening layers of connections and structures, such as transistors and isolations build on the substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a bottom electrode on a substrate;
a phase change material layer on the bottom electrode, wherein the phase change material layer comprises a similar lattice constant as a lattice constant of the bottom electrode; and
a top electrode on and vertically aligned with the phase change material layer and the bottom electrode.

2. The structure according to claim 1,
wherein the phase change material layer is selected from a group consisting of amorphous silicon, amorphous germanium and amorphous silicon germanium.

3. The structure according to claim 1,
wherein a first height of a first crystallized portion of the phase change material layer is 25% of a height of the phase change material layer, and the first height corresponds to a first resistive state of the structure,
wherein a second height of a second non-crystallized portion of the phase change material layer is 75% of the height of the phase change material layer, and the second height corresponds to a second resistive state of the structure,
wherein the second resistive state comprises a lower resistance than the first resistive state.

4. The structure according to claim 1, wherein a lower portion of the phase change material layer comprises crystallized amorphous silicon, and an upper portion of the phase change material layer comprises non-crystallized amorphous silicon.

5. The structure according to claim 1, wherein a width of the phase change material layer is equal to a width of the top electrode and a width of the bottom electrode.

6. The structure according to claim 1,
wherein the structure is formed directly on the substrate with no intervening structures.

7. The structure according to claim 1,
wherein the structure comprises multiple resistive states corresponding to multiple memory states, dependent upon an amount of crystallization of the phase change material layer.

8. A structure comprising:
a phase change material layer on a substrate, wherein the phase change material layer comprises a similar lattice constant as a lattice constant of the bottom electrode;
a top electrode on the substrate, adjacent to a first vertical side surface and overlapping a first portion of an upper horizontal surface of the phase change material layer; and
a bottom electrode on the substrate, adjacent to a second vertical side surface and overlapping a second portion of the upper horizontal surface of the phase change material layer.

9. The structure according to claim 8,
wherein a first height of a first crystallized portion of the phase change material layer is 25% of a height of the phase change material layer measured horizontally from the bottom electrode, and the first height corresponds to a first resistive state of the structure,
wherein a second height of a second non-crystallized portion of the phase change material layer is 75% of the height of the phase change material layer measured horizontally from the bottom electrode, and the second height corresponds to a second resistive state of the structure,
wherein the second resistive state comprises a lower resistance than the first resistive state.

10. The structure according to claim 8, wherein a first portion of the phase change material layer comprises crystallized amorphous silicon, and a second portion of the phase change material layer comprises non-crystallized amorphous silicon.

11. The structure according to claim 8,
wherein the structure is formed on the substrate above intervening structures.

12. The structure according to claim 8,
wherein the structure comprises multiple resistive states corresponding to multiple memory states, dependent upon an amount of crystallization of the phase change material layer.

* * * * *